United States Patent
Gibson et al.

(10) Patent No.: US 11,294,729 B2
(45) Date of Patent: Apr. 5, 2022

(54) RESOURCE PROVISIONING FOR MULTIPLE INVOCATIONS TO AN ELECTRONIC DESIGN AUTOMATION APPLICATION

(71) Applicant: Siemens Industry Software Inc., Plano, TX (US)

(72) Inventors: Patrick D. Gibson, Tualatin, OR (US); Robert A. Todd, Beaverton, OR (US)

(73) Assignee: Siemens Industry Software Inc., Plano, TX (US)

( * ) Notice: Subject to any disclaimer, the term of this patent is extended or adjusted under 35 U.S.C. 154(b) by 46 days.

(21) Appl. No.: 15/974,387

(22) Filed: May 8, 2018

(65) Prior Publication Data
US 2019/0347138 A1     Nov. 14, 2019

(51) Int. Cl.
| | |
|---|---|
| *G06F 9/50* | (2006.01) |
| *H04L 29/08* | (2006.01) |
| *G06F 30/30* | (2020.01) |
| *H04L 67/56* | (2022.01) |

(52) U.S. Cl.
CPC .......... *G06F 9/5055* (2013.01); *G06F 9/5038* (2013.01); *G06F 30/30* (2020.01); *H04L 67/28* (2013.01)

(58) Field of Classification Search
None
See application file for complete search history.

(56) References Cited

U.S. PATENT DOCUMENTS

| | | | |
|---|---|---|---|
| 9,223,915 B1* | 12/2015 | Ginetti | G06F 17/5022 |
| 2018/0349238 A1* | 12/2018 | Boshev | G06F 11/2094 |
| 2019/0158575 A1* | 5/2019 | Jan | G06F 9/5022 |
| 2019/0163584 A1* | 5/2019 | K | G06F 11/1658 |
| 2019/0235896 A1* | 8/2019 | Semmandampalayam | G06F 8/60 |
| 2019/0310873 A1* | 10/2019 | Amann | G06F 9/45558 |

\* cited by examiner

*Primary Examiner* — Wynuel S Aquino

(57) ABSTRACT

A system may include a resource acquisition engine configured to acquire a set of computing resources for execution of an application flow comprising multiple invocations to an EDA application. The system may also include a resource provision engine configured to provide the set of computing resources for execution of a first EDA process of the EDA application launched by a first invocation in the application flow and identify a second invocation subsequent to the first invocation in the application flow, the second invocation to launch a second EDA process of the EDA application. The resource provision engine may be further configured to, without releasing the set of computing resources provided to the first EDA process, proxy the set of computing resources into a proxied set of computing resources and provide the proxied set of computing resources for execution of the second EDA process of the EDA application.

20 Claims, 6 Drawing Sheets

RESOURCE PROVISIONING FOR MULTIPLE INVOCATIONS TO AN ELECTRONIC DESIGN AUTOMATION APPLICATION

BACKGROUND

Electronic circuits, such as integrated microcircuits, are used in nearly every facet of society, from automobiles to microwaves to personal computers. Design of microcircuits may involve many steps, known as a "design flow." The particular steps of a design flow often are dependent upon the type of microcircuit being designed, its complexity, the design team, and the microcircuit fabricator or foundry that will manufacture the microcircuit. Electronic design automation (EDA) applications support the design and verification of circuits prior to fabrication. EDA applications may include various functions, tools, or features to test or verify a design at various stages of the design flow, e.g., through execution of software simulators and/or hardware emulators for error detection.

SUMMARY

Disclosed implementations include systems, methods, devices, and logic that may support resource provisioning for multiple invocations to an EDA application.

In one example, a method may be performed, executed, or otherwise carried out by a computing system. The method may include providing a set of computing resources for execution of a first EDA process of an EDA application, the first EDA process launched by a first invocation in an application flow, the application flow comprising multiple invocations to the EDA application and identifying a second invocation subsequent to the first invocation in the application flow, the second invocation to launch a second EDA process of the EDA application. The method may also include, without releasing the set of computing resources provided to the first EDA process, proxying the set of computing resources into a proxied set of computing resources; and providing the proxied set of computing resources for execution of the second EDA process of the EDA application.

In another example, a system may include a resource acquisition engine and a resource provision engine. The resource acquisition engine may be configured to acquire a set of computing resources for execution of an application flow comprising multiple invocations to an EDA application. The resource provision engine may be configured to provide the set of computing resources for execution of a first EDA process of the EDA application launched by a first invocation in the application flow and identify a second invocation subsequent to the first invocation in the application flow, the second invocation to launch a second EDA process of the EDA application. The resource provision engine may be further configured to, without releasing the set of computing resources provided to the first EDA process, proxy the set of computing resources into a proxied set of computing resources and provide the proxied set of computing resources for execution of the second EDA process of the EDA application.

In yet another example, a non-transitory machine-readable medium may store processor-executable instructions. When executed, the instructions may cause a system to identify an application flow comprising multiple invocations to an EDA application; provide a set of computing resources for execution of a first EDA process of the EDA application launched by a first invocation in the application flow; and identify a second invocation subsequent to the first invocation in the application flow, the second invocation to launch a second EDA process of the EDA application. When executed, the instructions may further cause the system to, without releasing the set of computing resources provided to the first EDA process, proxy the set of computing resources into a proxied set of computing resources and provide the proxied set of computing resources for execution of the second EDA process of the EDA application.

BRIEF DESCRIPTION OF THE DRAWINGS

Certain examples are described in the following detailed description and in reference to the drawings.

DETAILED DESCRIPTION

The following disclosure relates to EDA applications or CAD systems which may be used to facilitate the design and manufacture of integrated circuits. As technology improves, modern circuit designs may include billions of components and more. EDA applications may include various features to aid circuit design, such as high-level synthesis, schematic capture, transistor or logic simulation, field solvers, functional and physical verifications, geometry processing, equivalence checking, design rule checks, and mask data preparation, as but a few examples.

In some cases, different EDA application features are implemented as distinct features or tools of an EDA application, or at times as different EDA applications altogether. In such examples, use of different EDA applications features (or tools) may require distinct startup processes, whether through separate startup scripts, command line instructions, mouse-clicks, or other distinct initiation procedures. These initiation procedures may be referred to as an invocation to execute an EDA process (e.g., an instance of an EDA tool or EDA application). Further complicating multiple invocations to an EDA application, a computing system may treat different EDA tools distinctly, requiring separate resource requests and effectuating separate resource reservations for invoked EDA tools and the execution of corresponding EDA processes. For successive invocations to different EDA tools of an EDA application, other computing processes, threads, or jobs may be compete for limited computing resources, which may reduce EDA application efficiency and increase execution latency.

The features described herein may support resource provisioning for multiple invocations to an EDA application. Instead of separate resource reservations and allocations for distinct EDA tools and EDA processes, the features described herein may support resource acquisition for multiple invocations to an EDA tool, including proxying computing resources for separate invocations to the EDA tool. In that regard, the resource provisioning features described herein may support the sharing of a common set of computing resources among multiple distinct EDA processes of EDA applications, including among EDA processes sub-invoked by other EDA processes. Such multiple-process and inter-process sharing of computing resources may reduce execution latency, for example by reducing user interaction (e.g., separate logins for each EDA application invocation) or reducing resource acquisition times between EDA processes. These and other benefits and features of the present disclosure are described in greater detail herein.

Figure 1:
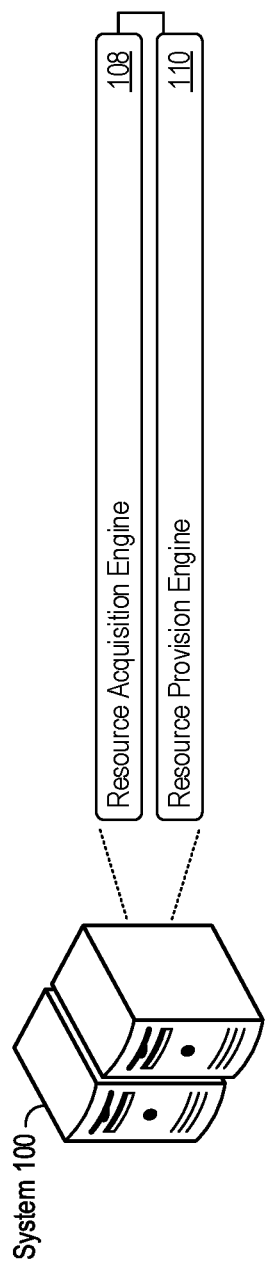
FIG. 1 shows an example of a system that supports resource provisioning for multiple invocations to an EDA application.

FIG. 1 shows an example of a system that supports resource provisioning for multiple invocations to an EDA application. The system 100 may take the form of a computing system, including a single or multiple computing devices such as application servers, compute nodes, data servers, desktop or laptop computers, smart phones or other mobile devices, tablet devices, embedded controllers, and more. The system 100 may be capable of provisioning resources among multiple EDA processes, for instance by acquiring computing resources for execution of an EDA application and proxying the acquired computing resources for execution of various EDA processes launched by different invocations to the EDA application.

In some implementations, the system 100 may maintain acquired resources, preventing release of acquired computing resources that have been proxied for a particular EDA process when the particular EDA process completes execution. The maintained computing resources may be further proxied and provided for execution of another EDA process, e.g., instead of being released for consumption or acquisition by other processes unrelated to the EDA application.

In connection with the various resource provisioning features described herein, the system 100 may implement, utilize, or otherwise support dynamic resource allocation, for example as described in U.S. patent application Ser. No. 15/873,827 filed on Jan. 17, 2018 and titled "DYNAMIC DISTRIBUTED RESOURCE MANAGEMENT" (the '827 application), which is incorporated herein by reference in its entirety. Computing resources used and proxied by the system 100 may be maintained and allocated according to various dynamic allocation features as described in the '827 application.

As an example implementation, the system 100 shown in FIG. 1 includes a resource acquisition engine 108 and a resource provision engine 110 that may support or provide the resource provisioning features described herein. The system 100 may implement the engines 108 and 110 (and components thereof) in various ways, for example as hardware and programming. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the system 100 implements multiple engine components or system elements using the same computing system features or hardware components (e.g., a common processor and common storage medium).

In operation, the resource acquisition engine 108 may acquire a set of computing resources for execution of an application flow comprising multiple invocations to an EDA application. The resource provision engine 110 may provide the set of computing resources for execution of a first EDA process of the EDA application launched by a first invocation in the application flow and identify a second invocation subsequent to the first invocation in the application flow, the second invocation to launch a second EDA process of the EDA application. Without releasing the set of computing resources provided to the first EDA process, the resource provision engine 110 may proxy the set of computing resources into a proxied set of computing resources and provide the proxied set of computing resources for execution of the second EDA process of the EDA application.

These and other resource provisioning features are described in greater detail next.

Figure 2:
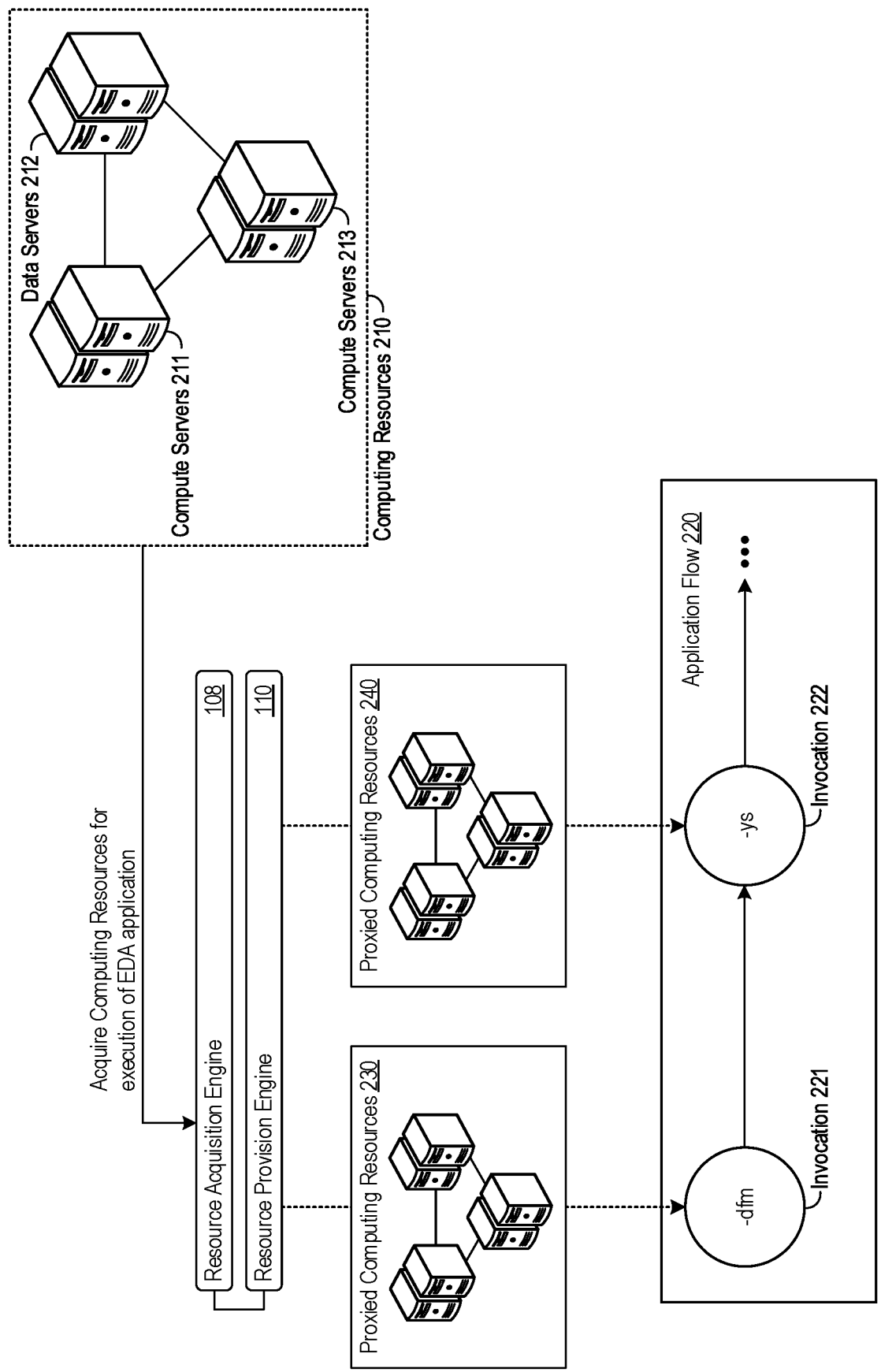
FIG. 2 shows an example of resource provisioning for an application flow by a resource acquisition engine and a resource provision engine.

FIG. 2 shows an example of resource provisioning for an application flow by the resource acquisition engine 108 and the resource provision engine 110. The resource provisioning examples presented in FIG. 2 may illustrate various mechanisms by which computing resources may be shared between multiple EDA application processes.

In the example shown in FIG. 2, the resource acquisition engine 108 acquires computing resources for execution of an EDA application. Acquisition of computing resources may refer to any reservation or allocation mechanism by which the resource acquisition engine 108 obtains the capability to use computing resources for execution of a task. For instance, the resource acquisition engine 108 may request resources for use in execution of an EDA application from a resource management system that distributes computing resources in a distributed processing system. Examples of resource management systems include load platform sharing (LSF) platforms, Grid, OpenLava, or other resource sharing programs that control use of physical or virtual computing resources of a computing environment.

The computing resources acquired by the resource acquisition engine 108 may include any physical or virtual computing element that can be used in connection with execution of an EDA application. As such, acquired computing resources may take various forms, such as compute servers, data servers, or combinations thereof (which may also include monitoring services), whether as remote resources, local resources, or combinations of both. In FIG. 2, the resource acquisition engine 108 acquires a set of computing resources shown as the computing resources 210. The computing resources 210 include compute servers 211, data servers 212, and compute servers 213, of which the servers 211, 212, and 213 may be remote to the resource acquisition engine 108 (or a primary host), local servers, or a combination of both remote and local servers. Although illustrated separately in FIG. 2, acquired computing resources may take the form of a single or multiple computing entities that provide any combination of capabilities (e.g., compute and/or data, and any applicable monitoring services) to support execution of an EDA application.

The resource acquisition engine 108 may request and acquire computing resources based on various factors. The specific number, type, or capability of the computing resources 210 acquired by the resource acquisition engine 108 may vary based on computational requirements of an EDA application (or tools and components thereof), availability of resources in a distributed computing environment, network latency, or several other factors. In some implementations, the resource acquisition engine 108 requests and acquires computing resources based on computation parameters EDA tools or processes launched through of one or more invocations to an EDA application, for example as specified in an application flow.

An application flow may refer to a sequence of invocations to an EDA application (or, optionally, multiple EDA applications). The application flow may be programmed as an initiation sequence for a series of EDA tools used for circuit design, for example various design rule checks, verification features, design suites, or other EDA functionality that a user or design team may utilize during circuit design. In some instances, an application flow may take the form of a launch script, a parameterized list of EDA tool applications, or any other format to specify a sequence of invocations to execute various EDA tools of an EDA application. In some implementations, the multiple invocations in an application flow may launch distinct EDA processes that require a respective set of computing resources for execution.

In the example shown in FIG. 2, the resource acquisition engine 108 acquires the computing resources 210 for execution of an EDA application, the functionality of which is accessed through the multiple invocations specified in an application flow 220. The application flow 220 may include multiple invocations to the EDA tool, two examples of which are illustrated in FIG. 2. A first invocation 221 may correspond to (e.g., launch) a first EDA process referenced as -dfm. The -dfm EDA process may, for example, correspond to a design-for-manufacture EDA tool that is part of an EDA application. A second invocation 222 of the application flow 220 may correspond to a second EDA process referenced as -ys. The -ys EDA process may correspond to a tool or functionality of the EDA application that is logically distinct or separate from the -dfm EDA process.

Using the computing resources 210 acquired by the resource acquisition engine 108, the resource provision engine 110 may selectively provision resources for execution of the EDA processes invoked via the application flow 220. In doing so, the resource provision engine 110 may provision the acquired resources (e.g., the computing resources 210) without releasing the resources back to a resource management system upon completing execution of launched EDA processes. In other words, the resource provision engine 110 may share the acquired computing resources 210 across different EDA processes, even though such EDA processes may be distinct and separately request and use computing resources during execution.

To do so, the resource provision engine 110 may, in effect, act as a resource distribution entity that provisions the acquired computing resources 210 to requesting EDA processes, including the EDA processes launched by the invocations 221 and 222. The resource provision engine 110 may proxy the acquired computing resources 210, serving as a proxy server or proxy host for resource consumption by launched EDA processes. In the example shown in FIG. 2, the resource provision engine 110 proxies the computing resources 210 into the proxied computing resources 230 and provides the proxied computing resources 230 for execution of an EDA processes launched by or otherwise corresponding to the invocation 221 of the application flow 220 (e.g., to execute the -dfm EDA process).

The resource provision engine 110 may proxy a set of computing resources in any way such that a proxy is set up between an EDA process and the actual computing resources acquired by the resource acquisition engine 108. In some implementations, the resource provision engine 110 creates a socket (or listening port) through which the -dfm EDA process launched by the invocation 221 can communicate resource consumption requests or otherwise issue tasks, jobs, or other commands for execution. The resource provision engine 110 may listen on the socket for such consumption requests and communicate the requests to the appropriate resource entities in the computing resources 210 to complete the request. In this scenario, the resource provision engine 110 may serve as a parent process or parent entity that proxies the computing resources 210 to a child process or entity, in this case the -dfm EDA process for the EDA application.

In some implementations, the resource provision engine 110 proxies computing resources individually. For instance, the resource provision engine 110 may proxy each individual server, compute node, data server, monitoring service, processor, or other compute resource of the computing resources 210, allowing the -dfm EDA process to reference proxied resources directly for task execution. As such, the resource provision engine 110 may correlate acquired computing resources (e.g., the servers 211, 212, and 213) to proxied resources provided to an invoked EDA process (e.g., proxied resources provided to a child process). When a parent process (or resource or proxied resource of a parent) ends (e.g., is killed or otherwise shut down), correlated child processes (or proxied child resources) are likewise shut down by the resource provision engine 110. The resource engine 110 may do so to maintain consistency between states of correlated resources, which may thus prevent inadvertent or improper access to a proxied or acquired computing resource that is no longer available.

The resource provision engine 110 may provide a set of proxied computing resources (also referred herein as a proxied set of computing resources) as requested for complete execution of an EDA process. When the EDA process completes execution, the resource provision engine 110 may release or otherwise deallocate the proxied computing resources from the EDA process and reassign the computing resources for execution of another EDA process, e.g., as launched by a subsequent invocation in an application flow 220. While the resource provision engine 110 may release the computing resources proxied for a particular EDA process, the resource provision engine 110 may maintain or keep the actually acquired resource sets (e.g., the computing resources 210) for subsequent provisioning to subsequently invoked EDA processes.

To illustrate through FIG. 2, the resource provision engine 110 may provide the proxied computing resources 230 to the -dfm EDA process launched by the invocation 221 in the application flow 220. Upon identification that the -dfm EDA process launched by the invocation 221 has completed execution, the resource provision engine 110 may deallocate the proxied computing resources 230 provided for the -dfm EDA process. In one sense, the resource provisioning engine 110 may reacquire the proxied computing resources 230 (that correlate to the acquired computing resources 210).

Without releasing the acquired computing resources 210 back to a resource management system (which may otherwise occur upon completion of an EDA process), the resource provision engine 110 may reassign the acquired computing resources 210 for execution of another EDA process. In FIG. 2, the resource provision engine 110, in effect, provides the computing resources 210 for execution of the -ys EDA process next launched by the invocation 222 to the EDA application, doing so in the form of the proxied computing resources 240. The computing resources 210 may be further shared and used by other EDA processes executed subsequent to completion of the -ys EDA process as well.

By thus proxying acquired computing resources, the resource provision engine 110 may ensure that computing resources allocated to an EDA process are properly released upon process completion, but nonetheless maintain the allocated resources for execution of subsequent EDA processes. The proxied computing resources are released upon process completion (as these were the actual computing resources that the EDA process recognizes), but the acquired computing resources remain for further proxying and pro-visioning.

In some instances, an EDA processes may sub-invoke other EDA processes. For instance a first EDA process may sub-invoke a second EDA process such that the second EDA process is invoked during execution (e.g., prior to completion) of the first EDA process. In such cases, the resource provision engine 110 may further proxy computing resources for execution of the sub-invoked process.

Figure 3:
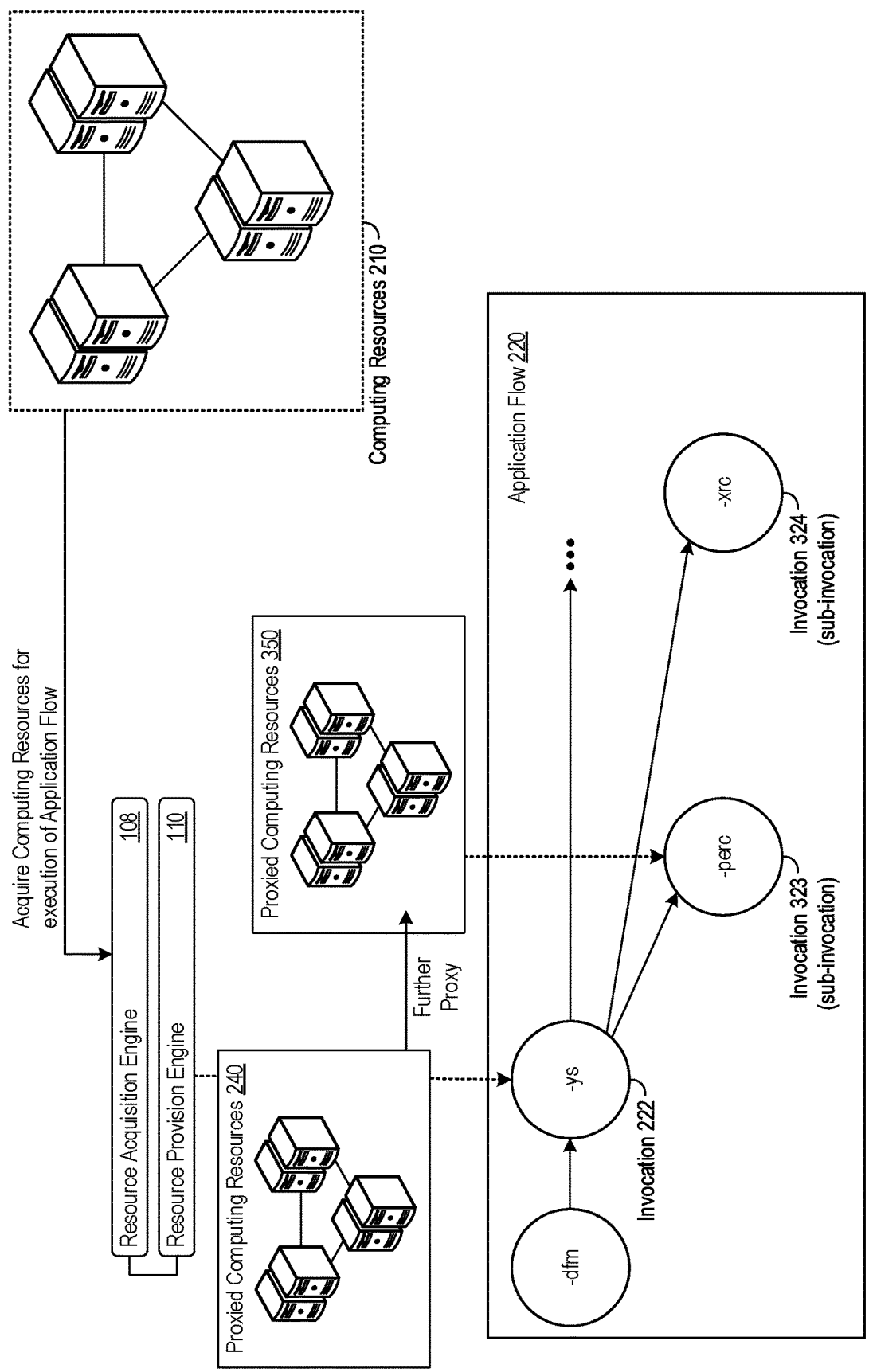
FIG. 3 shows an example of resourcing provisioning by the resource acquisition engine and the resource provision engine for an application flow that includes sub-invocations.

FIG. 3 shows an example of resourcing provisioning by the resource acquisition engine 108 and the resource provision engine 110 for an application flow that includes sub-invocations. In the example shown in FIG. 3, the application flow 220 includes the invocations 222, 323, and 324, with the invocations 323 and 324 depicted as sub-invocations of the invocation 222. Put another way, the -ys EDA process launched by the invocation 222 may itself launch (that is, sub-invoke) the -perc EDA process through the invocation 323 as well as the -xrc EDA process through the invocation 324. In scenarios such as this, the -ys EDA process that sub-invokes another process may be referred to as a parent process and the sub-invoked -perc or -xrc EDA processes may be referred to as child processes.

The resource provision engine 110 may provision resources to a child process sub-invoked by a parent process by further proxying the computing resources provided to the parent process. To illustrate through FIG. 3, the resource acquisition engine 108 may acquire the computing resources 210 for execution of an EDA application, and the resource provision engine 110 may proxy the computing resources 210 as the proxied computing resources 240. The resource provision engine 110 may then provide the proxied computing resources 240 for execution of the -ys EDA process launched by the invocation 222.

After execution of the invocation 323 to sub-invoke the -perc EDA process, the resource provision engine 110 may provision resources to execute the sub-invoked -perc EDA process. To do so, the resource provision engine 110 may further proxy the proxied resources 240 into the proxied resources 350. In doing so, the resource provision engine 110 may support recursive proxying of computing resources. By further (e.g., recursively) proxying the proxied resources 240, the resource provision engine 110 may correlate individual and sets of computing resources between the computing resources 210 actually acquired by the resource acquisition engine 108, the proxied computing resources 240 provided to the -ys EDA process, and the further proxied computing resources 350 provided to the sub-invoked -perc EDA process. Thus, for EDA process sub-invocations (e.g., an EDA process invoked within another EDA process), the resource provision engine 110 may track further proxied correlations (including recursively proxied computing resources to any degree or level), doing so to maintain a consistent state between resource assignments to different inter-related EDA processes.

To support communication between proxied resources, the resource provision engine 110 and other applicable elements of a computing system may support an internal proxy communication protocol, by which tasks, jobs, or other resource consumption requests can be propagated between various proxied entities and eventually to the acquired computing resources 210 for execution. As noted above, various sockets, listening ports, or other communication elements may be instantiated and used to support the requisite communications.

By further proxying computing resources for sub-invoked processes, the resource provision engine 110 may ensure that acquired computing resources are not released or otherwise deallocated for invocations to distinct EDA tools and features. In a consistent manner as described herein, the resource provision engine 110 may support any level of sub-invocations, e.g., any number of child EDA processes launched from an existing parent EDA process (which itself may be a child EDA process). Limits on sub-invocations may be enforced or required by user-settings or kernel limitations, and the resource provision engine 110 need not include any proxy or capability limitation. In other words, the resource provisioning features described herein may be consistently implemented to support sub-invocations of any degree or level, e.g., by recursively proxying computing resources for each sub-invocation to provide proxied computing resources for execution of launched EDA sub-processes.

In some examples, an EDA sub-process (child process) may request more computing resources than provided to the parent EDA process by the resource provision engine 110. An example of such a scenario is described next through FIG. 4.

Figure 4:
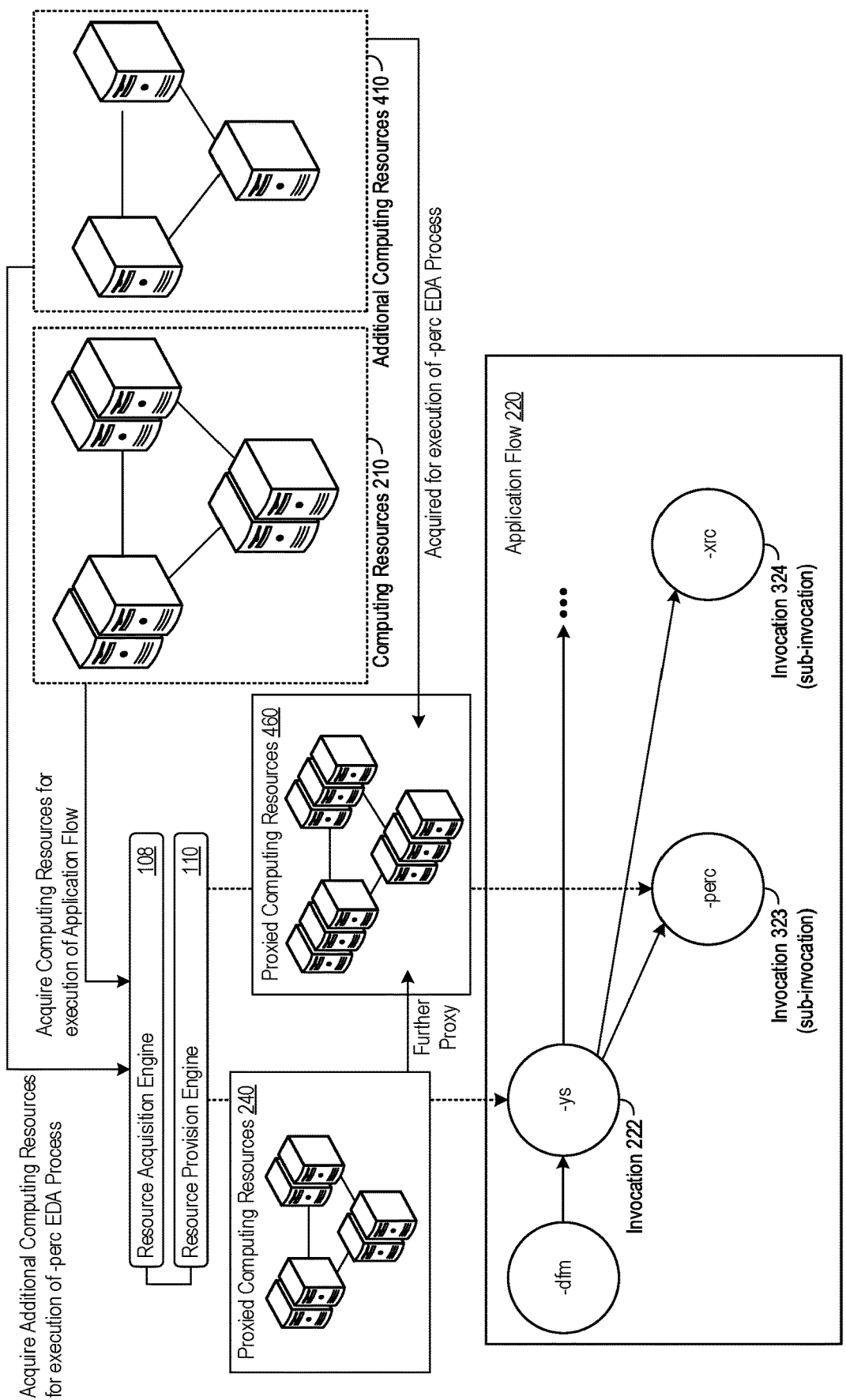
FIG. 4 shows an example of resourcing provisioning by the resource acquisition engine and the resource provision engine for an application that includes an additional resource request by an EDA application invocation.

FIG. 4 shows an example of resourcing provisioning by the resource acquisition engine 108 and the resource provision engine 110 for an application flow 220 that includes an additional resource request by an EDA application invocation. In FIG. 4 (consistent with the example shown in FIG. 3), the -ys EDA process sub-invokes the -perc EDA process through the invocation 323 to the EDA application. Through invocation 323, the -perc EDA process is launched, and in this example in FIG. 4, makes a resource request beyond a computing (or other) capability provided by the proxied computing resources 240 provided for execution of the -ys EDA process.

Responsive to a resource request by an EDA process that exceeds what the acquired computing resources 210 can provide, the resource acquisition engine 108 and resource provision engine 110 may together provision additional resources to satisfy the resource request. In this case, the resource acquisition engine 108 may acquire the additional computing resources 410 shown in FIG. 4, this on top of the computing resources 210 previously acquired for execution of the EDA application. Then, the resource provision engine 110 may provision a combined set of computing resources that includes the computing resources 210 and the additional computing resources 410.

As seen in the example of FIG. 4, the resource provision engine 110 may further proxy the proxied computing resources 240 (correlated to the computing resources 210) and provide the additional computing resources 410, combining these together to form the computing resources 460 provided for execution of the -perc EDA process. As the computing resources 460 include a mix of resources further proxied from the proxied computing resources 240 and the acquired additional computing resources 410, the resource provision engine 110 may maintain separate correlations for computing resources originating from different points of acquisition.

In some implementations, the resource provision engine 110 may limit access to computing resources additionally acquired for a child EDA process such that parent EDA processes are unable to access such additionally acquired computing resources. For instance, the resource provision engine 110 may proxy and provision the additional computing resources 410 for execution of the -perc EDA process without providing access or use of the additional computing resources 410 for execution of the -ys parent EDA process that sub-invoked the -erc EDA process (or, if applicable, any other parent EDA processes that sub-invoked the -ys EDA process).

Such a limitation may be handled by releasing additional acquired computing resources upon completion of the EDA process that requested the additional computing resources. In this case, the resource provision engine 110 may, upon determination that the -perc EDA process has completed execution, release or otherwise deallocate the additional computing resources 410 additionally acquired for execution of the -perc EDA process. Upon resuming execution of the -ys EDA process that sub-invoked the -perc EDA process, the resource provision engine 110 may thus ensure that the additional computing resources 410 are unavailable for use by the parent EDA process.

Additionally or alternatively, the resource provision engine 110 may provide access or use of computing resources additionally acquired for a given EDA process to child EDA processes sub-invoked by the given EDA process. That is, were the -perc EDA process (as shown in FIG. 4) to sub-invoke another EDA process, the resource provision engine 110 may further proxy the proxied computing resources 460 for provision to the sub-invoked (child) EDA process (e.g., via recursive proxying). Further children of this sub-invoked EDA process may likewise have access to the additional computing resources 410 as well, as the resource provision engine 110 may continue to recursively proxy the proxied computing resources 460 for each successive level of sub-invocations. Thus, the resource provisioning engine 110 may provide access to additionally acquired computing resources for a particular EDA process to any child EDA processes, grandchild EDA processes, great grandchild EDA processes, or further sub-invoked child EDA processes of any level in a chain of EDA process sub-invocations.

As described herein, a system may support various resource provisioning features to an EDA application through a resource acquisition engine 108 and a resource provisioning engine 110. Although illustrated as distinct entities in FIGS. 1-4, the engines 108 and 110 may be implemented in various ways.

In some implementations consistent with various features described above, EDA processes of an EDA application may include executable instructions or programming such that each EDA process itself implements features of the resource acquisition engine 108 and resource provision engine 110 (which, in combination with applicable hardware such as non-transitory machine-readable media, implement the engines 108 and 110). Such implementations may also take the form of EDA processes accessing or launching respective instantiations of programming that implements the features of the resource acquisition engine 108, the resource provision engine 110, or both. In such implementations, an initial EDA process may include programming to acquire computing resources for the EDA application and proxy the acquired computing resources to child EDA processes, for instance the -dfm EDA process shown in FIG. 2 via the invocation 221, the -ys EDA process via the invocation 222, etc. The -dfm and -ys EDA processes (and any subsequently invoked or sub-invoked EDA processes) may themselves include programming to implement the features of the engines 108 and 110. As such, execution of EDA processes may result in recursive proxying of computing resources, as each sub-invoked EDA process may proxy its available computing resources for execution of the sub-invoked EDA process.

Further, in these implementations, any launched EDA process may itself acquire additional computing resources, thus implementing features of the resource acquisition engine 108. In that regard, the -perc EDA process illustrated in FIG. 4 may itself acquire the additional computing resources 410 consistent with the features of the resource acquisition engine 108 described herein. In doing so, the -perc EDA process itself may limit access to the additional computing resources 410 to children EDA processes of any level (as the parent -ys EDA process to the -perc EDA process is not aware the additional computing resources 410 were acquired). Through each launched EDA process implementing the resource provisioning features of the engines 108 and 110, recursive proxying of computing resources is possible. A parent EDA process may proxy its computing resources to a sub-invoked child EDA process, and such proxying may recursively occur for each level of subsequent sub-invocations. As such, the resource acquisition engine 108 and resource provision engine 110 may be implemented as programming of individual EDA processes in combination with applicable hardware.

As another implementation, the resource acquisition engine 108 and resource provision engine 110 may be implemented distinctly from other EDA processes. In that regard, the programming for the resource acquisition engine 108 and resource provision engine 110 may execute an EDA process (or distinct set of EDA processes) that acquires and provisions computing resources for other EDA processes invoked by an application flow. In such an implementation, the resource provision engine 110 need not recursively proxy computing resources to various sub-invocations of EDA processes. Instead, each launched EDA process (whether sub-invoked by a parent EDA process or not) may interface with the resource acquisition engine 108 and resource provision engine 110 to acquire computing resources for execution. In some examples, the resource provision engine 110 may nonetheless proxy acquired computing resources to provide to launched EDA processes in an application flow. In such cases, recursive proxying need not be performed as the resource provision engine 110 may serve as a managing entity separate from individual EDA process to provision computing resources, in contrast to each EDA process proxying computing resources level by level in a recursive series of sub-invocations.

As such, the resource acquisition engine 108 and resource provision engine 110 may implement the various resource provisioning features described herein. Any combination of the various features and implementations are contemplated.

Figure 5:
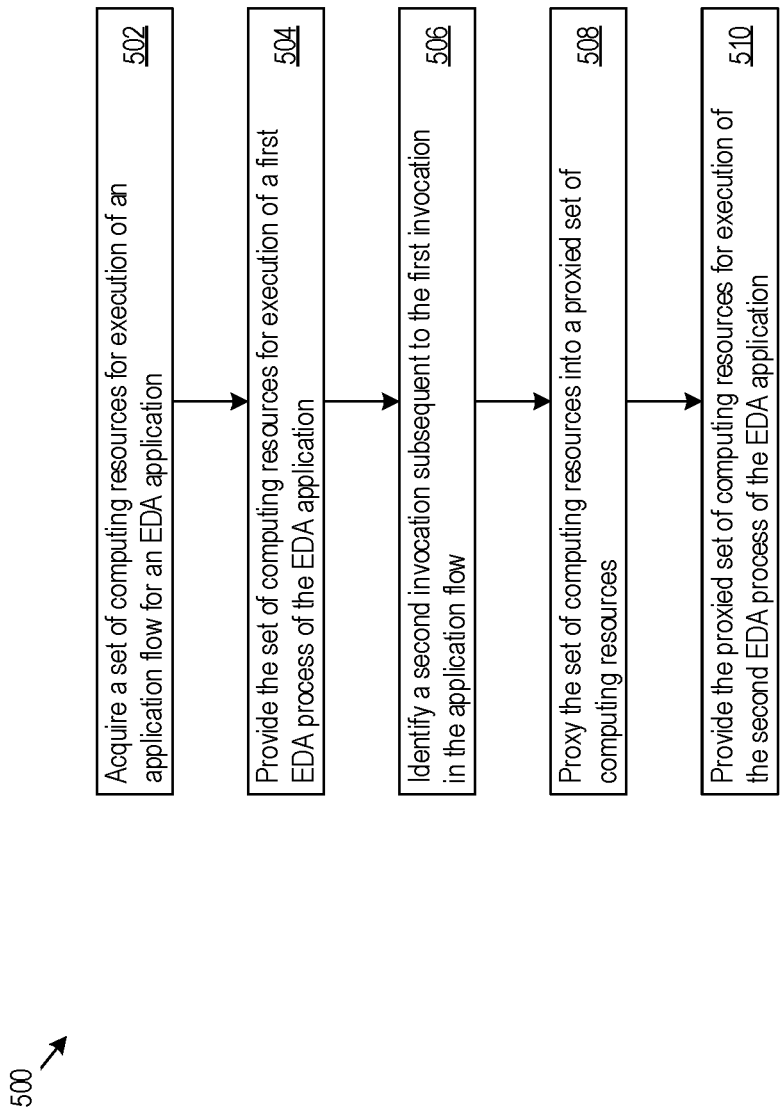
FIG. 5 shows an example of logic that a system may implement to support resource provisioning for multiple invocations to an EDA application.

FIG. 5 shows an example of logic 500 that a system may implement to support resource provisioning for multiple invocations to an EDA application. In some examples, the system 100 may implement the logic 500 as hardware, executable instructions stored on a machine-readable medium, or as a combination of both. The system 100 may implement the logic 500 via the resource acquisition engine 108 and the resource provision engine 110, through which the system 100 may perform or execute the logic 500 as a method to support resource provisioning for multiple invocations to an EDA application. The following description of the logic 500 is provided using the resource acquisition engine 108 and the resource provision engine 110 as implementation examples. However, various other implementation options by a system are possible.

In implementing the logic 500, the resource acquisition engine 108 may acquire a set of computing resources for execution of an application flow for an EDA application (502). In implementing the logic 500, the resource provision engine 110 may provide a set of computing resources for execution of a first EDA process of an EDA application (504), for example as proxied from the set of computing resources acquired by the resource acquisition engine 108. The first EDA process may be launched by a first invocation in an application flow, and the application flow including multiple invocations to the EDA application. The resource provision engine 110 may further identify a second invocation subsequent to the first invocation in the application flow (506), and the second invocation may be to launch a second EDA process of the EDA application. Without releasing the set of computing resources provided to the first EDA process, the resource provision engine 110 may proxying the set of computing resources into a proxied set of computing resources (508), and further provide the proxied set of computing resources for execution of the second EDA process of the EDA application (510).

In some examples, the second invocation is invoked in the application flow after execution of the first EDA process completes. In such examples, the resource provision engine 110 may proxy the set of computing resources and provide the proxied set of computing resources for execution of the second invocation after the first EDA process has completed execution. In other examples, the second invocation is sub-invoked by the first invocation such that the second invocation is invoked during execution of the first EDA process. As such, the resource provision engine 110 may proxy the set of computing resources and provide the proxied set of computing resources for execution of the second invocation before the first EDA process has completed execution (e.g., during execution of the first EDA process).

Prior to the second EDA process completing execution, the resource provision engine 110 may identify an additional resource request for execution of the second EDA process beyond the proxied set of computing resources provided to the second EDA process. Responsive to such an identification, the resource acquisition engine 108 may reserve, for execution of the second EDA process, additional computing resources according to the additional resource request, and the resource provision engine 110 may provide the additional computing resources for execution of the second EDA process without providing access to the additional computing resources for execution of the first EDA process. Further, the resource provision engine 110 may identify a third invocation sub-invoked by the second invocation in the application flow, the third invocation to launch a third EDA process of the EDA application. In response and without releasing the proxied set of computing resources and the additional computing resources provided to the second EDA process, the resource provision engine 110 may further proxy the proxied set of computing resources and additional computing resources into a further proxied set of computing resources and provide the further proxied set of computing resources for execution of the third EDA process of the EDA application.

After the second EDA process has completed execution, the resource provision engine 110 may return the set of computing resources, that were proxied into the proxied set of computing resources, back for execution of the first EDA process and the resource acquisition engine 108 may deallocate or release the additional computing resources acquired for execution of the second EDA process, e.g., back to a resource management system from which the additional computing resources were acquired from.

While various examples are shown and described through FIG. 5, the logic 500 may include any number of additional or alternative steps as well. The logic 500 may additionally or alternatively implement any other resource provisioning features described herein, for example any with respect to the resource acquisition engine 108, the resource provision engine 110, or a combination thereof.

Figure 6:
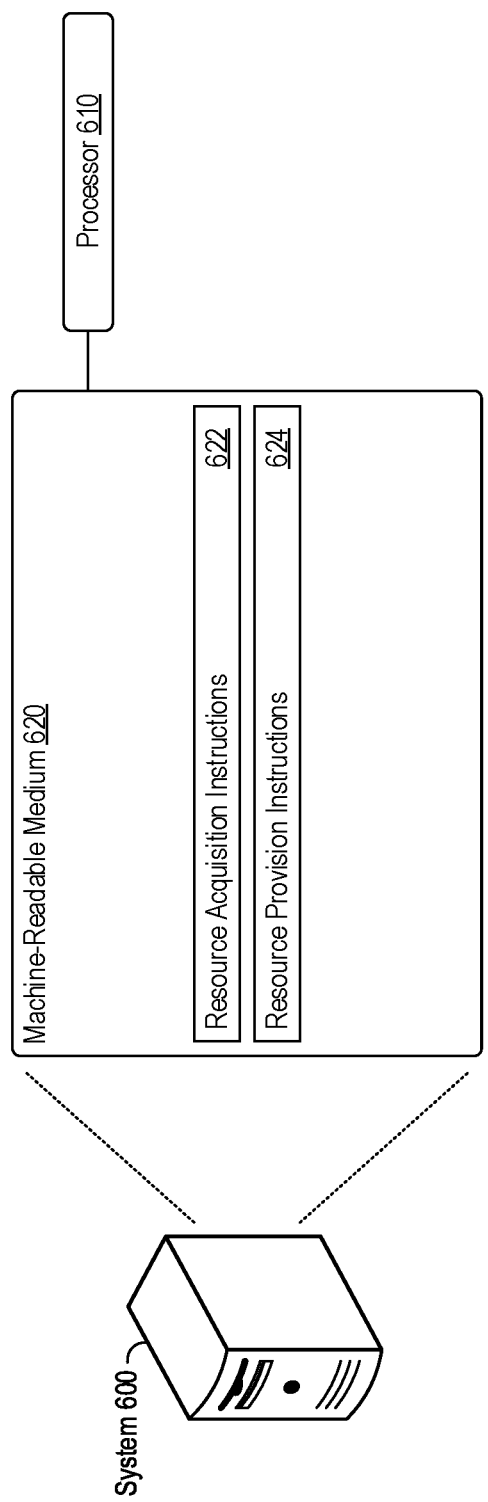
FIG. 6 shows an example of a system that supports resource provisioning for multiple invocations to an EDA application.

FIG. 6 shows an example of a system 600 that supports resource provisioning for multiple invocations to an EDA application. The system 600 may include a processor 610, which may take the form of a single or multiple processors. The processor(s) 610 may include a central processing unit (CPU), microprocessor, or any hardware device suitable for executing instructions stored on a machine-readable medium. The system 600 may include a machine-readable medium 620. The machine-readable medium 620 may take the form of any non-transitory electronic, magnetic, optical, or other physical storage device that stores executable instructions, such as the resource acquisition instructions 622 and resource provision instructions 624 shown in FIG. 6. As such, the machine-readable medium 620 may be, for example, random access memory (RAM) such as a dynamic RAM (DRAM), flash memory, spin-transfer torque memory, an electrically-erasable programmable read-only memory (EEPROM), a storage drive, an optical disk, and the like.

The system 600 may execute instructions stored on the machine-readable medium 620 through the processor 610. Executing the instructions may cause the system 600 to perform any of the resource provisioning features described herein, including according to any of the features of the resource acquisition engine 108, the resource provision engine 110, or combinations of both.

For example, execution of the resource acquisition instructions 622 by the processor 610 may cause the system 600 to acquire a set of computing resources for execution of an application flow for an EDA application. Execution of the resource provision instructions 624 by the processor 610 may cause the system 600 to identify an application flow comprising multiple invocations to an EDA application, provide a set of computing resources for execution of a first EDA process of the EDA application launched by a first invocation in the application flow, and identify a second invocation subsequent to the first invocation in the application flow, the second invocation to launch a second EDA process of the EDA application. Execution of the resource provision instructions 624 by the processor 610 may further cause the system 600 to, without releasing the set of computing resources provided to the first EDA process, proxy the set of computing resources into a proxied set of computing resources and provide the proxied set of computing resources for execution of the second EDA process of the EDA application.

The systems, methods, devices, and logic described above, including the resource acquisition engine 108 and the resource provision engine 110, may be implemented in many different ways in many different combinations of hardware, logic, circuitry, and executable instructions stored on a machine-readable medium. For example, the resource acquisition engine 108, the resource provision engine 110, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the resource acquisition engine 108, the resource provision engine 110, or combinations of both.

The processing capability of the systems, devices, and engines described herein, including the resource acquisition engine 108 and the resource provision engine 110, may be distributed among multiple system components, such as among multiple processors and memories, optionally including multiple distributed processing systems or cloud/network elements. Parameters, databases, and other data structures, such as the inter-artifact model repository 120, may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
through a computing system:
acquiring a set of computing resources for execution of an application flow of an electronic design automation (EDA) application, wherein the application flow comprises multiple invocations to launch different EDA processes of the EDA application;
identifying a first invocation subsequent in the application flow, the first invocation to launch a first EDA process of the EDA application;
proxying the set of computing resources into a proxied set of computing resources such that a first proxy is set up between the first EDA process and the set of computing resources;
providing the proxied set of computing resources for execution of the first EDA process of the EDA application;
identifying a second invocation in the application flow, wherein the second invocation is sub-invoked by the first invocation such that the second invocation is invoked during execution of the first EDA process, and in response:
proxying the proxied set of computing resources provided to the first EDA process into a further proxied set of computing resources such that a second proxy is set up between the second EDA process and the proxied set of computing resources provided for the first EDA process; and
providing the further proxied set of computing resources for execution of the second EDA process of the EDA application.

2. The method of claim 1, wherein proxying the proxied set of computing resources into the further proxied set of computing resources and providing the further proxied set of computing resources for execution of the second EDA process occurs before the first EDA process has completed execution.

3. The method of claim 1, further comprising, prior to the second EDA process completing execution:
identifying an additional resource request for execution of the second EDA process beyond the further proxied set of computing resources provided to the second EDA process;
reserving, for execution of the second EDA process, additional computing resources according to the additional resource request; and
providing the additional computing resources for execution of the second EDA process without providing access to the additional computing resources for execution of the first EDA process.

4. The method of claim 3, further comprising maintaining separate correlations for computing resources originating from different points of acquisition, including maintaining different correlations for the further proxied set of computing resources proxied from the proxied set of computing resources provided to the first EDA process and the additional computing resources acquired for execution of the second EDA process.

5. The method of claim 3, further comprising:
identifying a third invocation sub-invoked by the second invocation in the application flow, the third invocation to launch a third EDA process of the EDA application; and
without releasing the further proxied set of computing resources and the additional computing resources provided to the second EDA process:
combining the further proxied set of computing resources and additional computing resources into a combined set of computing resources; and
providing the combined set of computing resources for execution of the third EDA process of the EDA application.

6. The method of claim 3, further comprising, after the second EDA process has completed execution:
returning the proxied set of computing resources, that was proxied into the further proxied set of computing resources, back for execution of the first EDA process; and
deallocating the additional computing resources acquired for execution of the second EDA process.

7. The method of claim 1, further comprising, after providing the further proxied set of computing resources for execution of the second EDA process:
determining that the second EDA process sub-invoked by the first EDA process has completed execution; and
deallocating the further proxied set of computing resources provided for the second EDA process.

8. A system comprising:
a resource acquisition engine configured to:
acquire a set of computing resources for execution of an application flow of an electronic design automation (EDA) application, wherein the application flow comprises multiple invocations to launch different EDA processes of the EDA application; and
a resource provision engine configured to:
identify a first invocation subsequent in the application flow, the first invocation to launch a first EDA process of the EDA application;
proxy the set of computing resources into a proxied set of computing resources such that a first proxy is set up between the first EDA process and the set of computing resources;

provide the proxied set of computing resources for execution of the first EDA process of the EDA application; and identify a second invocation in the application flow, wherein the second invocation is sub-invoked by the first invocation such that the second invocation is invoked during execution of the first EDA process, and in response:

proxy the proxied set of computing resources provided to the first EDA process into a further proxied set of computing resources such that a second proxy is set up between the second EDA process and the proxied set of computing resources provided for the first EDA process; and provide the further proxied set of computing resources for execution of the second EDA process of the EDA application.

9. The system of claim 8, wherein the resource provision engine is configured to proxy the proxied set of computing resources into the further proxied set of computing resources and provide the further proxied set of computing resources for execution of the second EDA process before the first EDA process has completed execution.

10. The system of claim 8, wherein the resource provision engine is further configured to, prior to the second EDA process completing execution:

identify an additional resource request for execution of the second EDA process beyond the further proxied set of computing resources provided to the second EDA process;

reserve, for execution of the second EDA process, additional computing resources according to the additional resource request; and provide the additional computing resources for execution of the second EDA process without providing access to the additional computing resources for execution of the first EDA process.

11. The system of claim 10, wherein the resource provision engine is further configured to maintain separate correlations for computing resources originating from different points of acquisition, including maintaining different correlations for the further proxied set of computing resources proxied from the proxied set of computing resources provided to the first EDA process and the additional computing resources acquired for execution of the second EDA process.

12. The system of claim 10, wherein the resource provision engine is further configured to:

identify a third invocation sub-invoked by the second invocation in the application flow, the third invocation to launch a third EDA process of the EDA application; and without releasing the further proxied set of computing resources and the additional computing resources provided to the second EDA process:

combine the further proxied set of computing resources and additional computing resources into a combined set of computing resources; and provide the combined set of computing resources for execution of the third EDA process of the EDA application.

13. The system of claim 10, wherein the resource provision engine is further configured to, after the second EDA process has completed execution:

return the proxied set of computing resources, that was proxied into the further proxied set of computing resources, back for execution of the first EDA process; and deallocate the additional computing resources acquired for execution of the second EDA process.

14. The system of claim 8, wherein the resource provision engine is further configured to, after providing the further proxied set of computing resources for execution of the second EDA process:

determine that the second EDA process sub-invoked by the first EDA process has completed execution; and deallocate the further proxied set of computing resources provided for the second EDA process.

15. A non-transitory machine-readable medium storing instructions that, when executed by a processor, cause a computing system to:

acquire a set of computing resources for execution of an application flow of an electronic design automation (EDA) application, wherein the application flow comprises multiple invocations to launch different EDA processes of the EDA application;

identify a first invocation subsequent in the application flow, the first invocation to launch a first EDA process of the EDA application;

proxy the set of computing resources into a proxied set of computing resources such that a first proxy is set up between the first EDA process and the set of computing resources;

provide the proxied set of computing resources for execution of the first EDA process of the EDA application; and identify a second invocation in the application flow, wherein the second invocation is sub-invoked by the first invocation such that the second invocation is invoked during execution of the first EDA process, and in response:

proxy the proxied set of computing resources provided to the first EDA process into a further proxied set of computing resources such that a second proxy is set up between the second EDA process and the proxied set of computing resources provided for the first EDA process; and provide the further proxied set of computing resources for execution of the second EDA process of the EDA application.

16. The non-transitory machine-readable medium of claim 15, wherein the instructions further cause the computing system to, prior to the second EDA process completing execution:

identify an additional resource request for execution of the second EDA process beyond the further proxied set of computing resources provided to the second EDA process;

reserve, for execution of the second EDA process, additional computing resources according to the additional resource request; and provide the additional computing resources for execution of the second EDA process without providing access to the additional computing resources for execution of the first EDA process.

17. The non-transitory machine-readable medium of claim 16, wherein the instructions further cause the computing system to maintain separate correlations for computing resources originating from different points of acquisition, including maintaining different correlations for the further proxied set of computing resources proxied from the proxied set of computing resources provided to the first EDA process and the additional computing resources acquired for execution of the second EDA process.

18. The non-transitory machine-readable medium of claim 16, wherein the instructions further cause the computing system to:
identify a third invocation sub-invoked by the second invocation in the application flow, the third invocation to launch a third EDA process of the EDA application; and
without releasing the further proxied set of computing resources and the additional computing resources provided to the second EDA process:
combine the further proxied set of computing resources and additional computing resources into a combined set of computing resources; and
provide the combined set of computing resources for execution of the third EDA process of the EDA application.

19. The non-transitory machine-readable medium of claim 16, wherein the instructions further cause the computing system to, after the second EDA process has completed execution:
return the proxied set of computing resources, that was proxied into the further proxied set of computing resources, back for execution of the first EDA process; and
deallocate the additional computing resources acquired for execution of the second EDA process.

20. The non-transitory machine-readable medium of claim 15, wherein the instructions further cause the computing system to, after the second EDA process has completed execution:
determine that the second EDA process sub-invoked by the first EDA process has completed execution; and
deallocate the further proxied set of computing resources provided for the second EDA process.

* * * * *